United States Patent
Huang et al.

(10) Patent No.: US 6,656,667 B2
(45) Date of Patent: Dec. 2, 2003

(54) MULTIPLE RESIST LAYER PHOTOLITHOGRAPHIC PROCESS

(75) Inventors: I-Hsiung Huang, Kaohsiung (TW); Jiunn-Ren Hwang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 39 days.

(21) Appl. No.: 09/835,013

(22) Filed: Apr. 13, 2001

(65) Prior Publication Data

US 2002/0132189 A1 Sep. 19, 2002

(30) Foreign Application Priority Data

Mar. 14, 2001 (TW) ........................................ 90105911 A

(51) Int. Cl.$^7$ .............................. G03F 7/00; G03C 5/00
(52) U.S. Cl. ...................... 430/322; 430/312; 430/313; 430/328; 430/394
(58) Field of Search ............................... 430/312, 313, 430/328, 394

(56) References Cited

U.S. PATENT DOCUMENTS

| | | | | |
|---|---|---|---|---|
| 3,506,441 A | * | 4/1970 | Gottfried | ................... 430/312 |
| 4,904,569 A | * | 2/1990 | Fukuda et al. | ............... 430/311 |
| 5,134,058 A | * | 7/1992 | Han | ........................... 430/327 |
| 5,631,112 A | * | 5/1997 | Tsai et al. | ................... 430/394 |
| 5,641,609 A | * | 6/1997 | Nishimoto | .................. 430/313 |
| 5,770,350 A | * | 6/1998 | Lee | ............................. 430/325 |
| 5,989,788 A | * | 11/1999 | Bae et al. | .................... 430/326 |
| 6,015,650 A | * | 1/2000 | Bae | ............................. 430/314 |

* cited by examiner

*Primary Examiner*—Mark F. Huff
*Assistant Examiner*—Kripa Sagar
(74) *Attorney, Agent, or Firm*—J.C. Patents

(57) ABSTRACT

A multiple resist layer photolithographic process. A substrate having an insulation layer and a first photoresist layer sequentially stacked thereon is provided. A first light-exposure is conducted to transfer a pattern on a photomask to the first photoresist layer, thereby forming a first exposure pattern. A post-exposure baking is carried out and then the first photoresist layer is developed. A second photoresist layer is formed over the patterned first photoresist layer. A second photo-exposure is conducted to transfer the pattern on the same photomask to the second photoresist layer, thereby forming a second exposure pattern. The second exposure pattern and the first exposure pattern are aligned. Finally, the second photoresist layer is developed.

8 Claims, 1 Drawing Sheet

MULTIPLE RESIST LAYER PHOTOLITHOGRAPHIC PROCESS

CROSS-REFERENCE TO RELATED APPLICATION

This application claims the priority benefit of Taiwan application serial no. 90105911, filed Mar. 14, 2001.

BACKGROUND OF THE INVENTION

1. Field of Invention

The present invention relates to a photolithographic process. More particularly, the present invention relates to a multiple resist layer photolithographic process.

2. Description of Related Art

Due to the increase level of circuit integration, dimensions of circuit devices must be reduced correspondingly. One of the critical steps in the fabrication of integrated circuits fabrication is photolithography. Many processes that are related to the fabrication of a metal-oxide-semiconductor (MOS) device such as thin film patterning and dopant implantation depends on photolithography. More importantly, whether the semiconductor industry is able to fabricated integrated circuits with line width smaller than 0.18 $\mu$m depends very much on further improvement of photolithographic processes in the future.

However, as size of contact openings is reduced to 0.2 $\mu$m and less, step height difference on a silicon wafer between the peripheral circuit region and the device region, having semiconductor devices and conductive structures thereon, has become increasingly critical. Hence, if contact openings need to be simultaneously formed in the peripheral circuit region and the device region, adjusting depth of focus of the photoresist layer in both regions to a similar level becomes very difficult. Consequently, resolution of the photolithographic process is greatly lowered. In addition, consideration regarding the etching selectivity ratio in subsequent etching process, thickness of a photoresist layer cannot be smaller than 0.5 $\mu$m. Therefore, adjusting depth of focus in the device region and the peripheral circuit region simultaneously by lowering photoresist thickness is highly inappropriate.

SUMMARY OF THE INVENTION

Accordingly, one object of the present invention is to provide a multiple resist layer photolithographic process. First, a substrate having an insulation layer and a first photoresist layer sequentially stacked thereon is provided. A first light-exposure is conducted to transfer a pattern on a photomask to the first photoresist layer, thereby forming a first exposure pattern. A post-exposure baking is carried out and then the first photoresist layer is developed. Thereafter, a second photoresist layer is formed over the patterned first photoresist layer. A second photo-exposure is conducted to transfer the pattern on the same photomask to the second photoresist layer, thereby forming a second exposure pattern. The second exposure pattern and the first exposure pattern are aligned. Finally, the second photoresist layer is developed.

Since each of the first and the second photoresist layer has a thickness smaller than 0.5 $\mu$m (between 0.1 to 0.4 $\mu$m), the multi-patterning step can individually adjust thickness of resist in the device region and the peripheral circuit region. Ultimately, depth of focus in both regions will fall within a similar range. Hence, process window and resolution of photolithography can be greatly increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
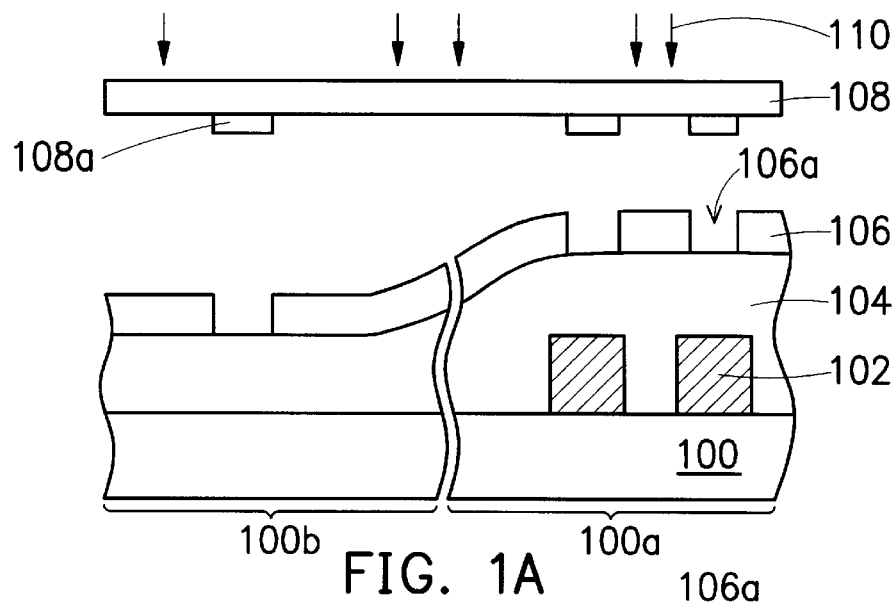
FIGS. 1A through 1C are schematic cross-sectional views showing the progression of steps for carrying out a multiple resist photolithographic process according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
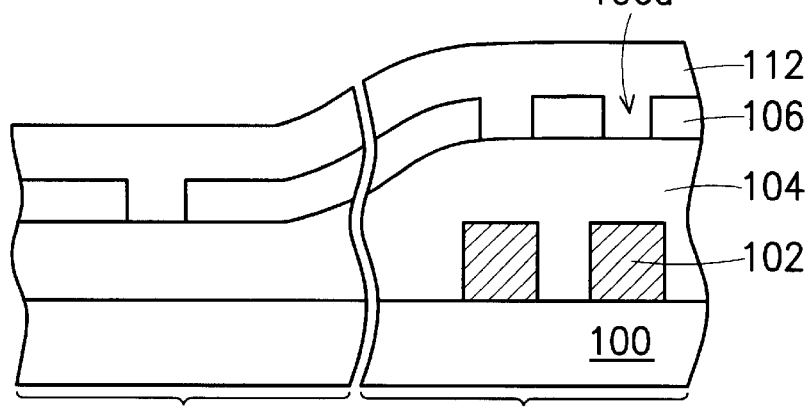
Figure 1C:
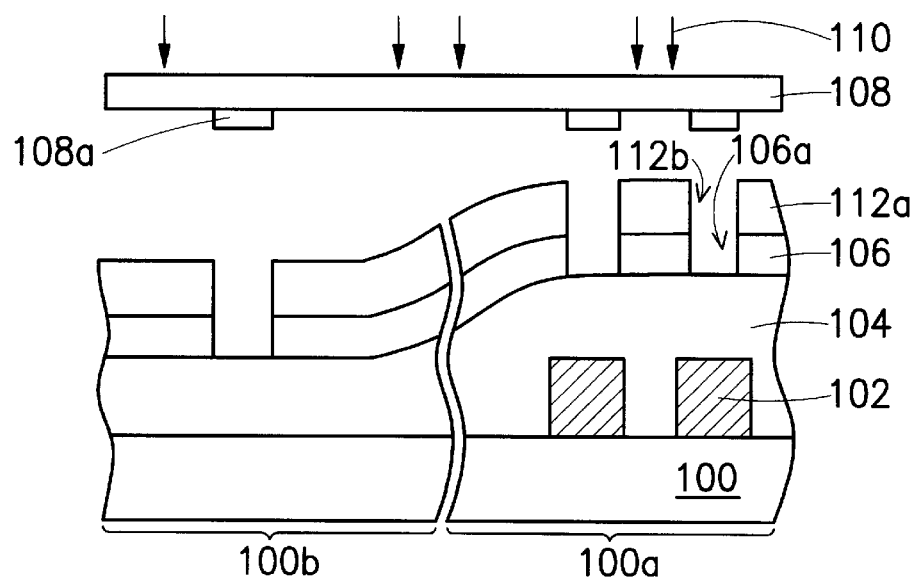

FIGS. 1A through 1C are schematic cross-sectional views showing the progression of steps for carrying out a multiple resist photolithographic process according to one preferred embodiment of this invention.

As shown in FIG. 1A, a substrate 100 is provided. The substrate 100 is divided into a device region 100a and a peripheral circuit region 100b. In addition, a plurality of semiconductor devices (not shown) and a plurality of conductive structures 102 have already formed over the device region 100a. An insulation layer 104 is formed over the substrate 100. The insulation layer 104 can be a silicon oxide layer or a silicon nitride layer formed, for example, by chemical vapor deposition. Due to the presence of semiconductor devices and conductive structures 102 in the device region 100a, a step height difference is created between the device region 100a and the peripheral circuit region 100b.

A photoresist layer 106 is formed over the insulation layer 104. The photoresist layer 106 can be a negative resist, or preferably, a deep ultraviolet photoresist having a thickness of between about 0.1 to 0.4 $\mu$m. A light exposure 110 is conducted to transfer a pattern 108a on a photomask 108 to the photoresist layer 106. A post-exposure baking is conducted and then the photoresist is developed so that an opening 106a is formed in the photoresist layer 106. The opening 106a exposes a portion of the insulation layer 104.

Since a step height exists between the device region 100a and the peripheral region 100b, depth of focus in these regions is difficult to adjust in a conventional process. In this invention, however, a rather thin photoresist layer 106 is formed over the substrate 100. Hence, depth of focus in the device region 100a and the peripheral region 100b can be easily adjusted to fall within a definite range. Consequently, tolerance and resolution of the photolithographic process is improved considerably.

As shown in FIG. 1B, a photoresist layer 112 is formed over the photoresist layer 106. The photoresist layer 112 can be a negative photoresist, or preferably, a deep ultraviolet photoresist having a thickness between about 0.1 to 0.4 $\mu$m.

As shown in FIG. 1C, a light exposure 110 is conducted to transfer the pattern 108a on the photomask 108 to the photoresist layer 112. Similarly, a post-exposure baking is conducted and then the photoresist layer 112 is developed so that the photoresist layer 112 is transformed to a photoresist layer 112a having an opening 112a. The opening 112b is aligned with the opening 106a so that a portion of the insulation layer 104 is exposed.

The photoresist layers 106 and 112a in the photoresist stack are patterned individually. Moreover, each of them has a thickness (about 0.1 to 0.4 $\mu$m) smaller than a conventional photoresist layer (about 0.5 $\mu$m or bigger). Hence, the critical dimension of the openings are more uniform, depth of focus of the photoresist layer in the device region 110a and the peripheral circuit region 100b can be adjusted to a similar range and resolution of the photolithographic process can be increased considerably. Therefore, the line width of the device can be further shrank.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of increasing depth of focus in a photolithographic process, comprising the steps of:

providing a substrate that can be divided into a first region and a second region;

forming an insulation layer over the substrate, wherein a step height difference exists between the first region and the second region;

forming a first photoresist layer over the insulation layer in both the first region and the second region;

performing a first photolithographic process to transfer a pattern on a photomask to the first photoresist layer on the first region and the second region, thereby forming a first pattern that exposes a portion of the insulation layer;

forming a second phtotresist layer over the first phtotresist layer on the first region and the second region; and performing a second photolithographic process to transfer the pattern on the photomask to the second photoresist layer on the first region and the second region, thereby forming a second pattern, wherein the second pattern is aligned with the first pattern so that the portion of the insulation layer is exposed again.

2. The method of claim 1, wherein the first and the second photoresist layers are negative photoresist layers.

3. The method of claim 1, wherein the photomask includes a bright field mask.

4. The method of claim 1, wherein the first photoresist layer has a thickness between about 0.1 to 0.4 $\mu$m.

5. The method of claim 1, wherein the first photoresist layer includes a deep ultraviolet photoresist layer.

6. The method of claim 1, wherein the second photoresist layer includes a deep ultraviolet photoresist layer.

7. The method of claim 1, wherein the second photoresist layer has a thickness between about 0.1 to 0.4 $\mu$m.

8. The method of claim 1, wherein the first region comprises a device region, and the second region comprises a peripheral circuit region.

* * * * *